United States Patent [19]

Nagao et al.

[11] Patent Number: 5,488,581
[45] Date of Patent: Jan. 30, 1996

[54] SEMICONDUCTOR MEMORY DEVICE

[75] Inventors: Mitsuhiro Nagao; Kohji Shimbayashi; Yoshiyuki Ishida, all of Kasugai, Japan

[73] Assignees: Fujitsu Limited, Kawasaki; Fujitsu VLSI Limited, Kasugai, both of Japan

[21] Appl. No.: 288,927

[22] Filed: Aug. 11, 1994

[30] Foreign Application Priority Data

Oct. 28, 1993 [JP] Japan ..................... 5-270984

[51] Int. Cl.[6] ....................................... G11C 7/00
[52] U.S. Cl. ................... 365/189.05; 365/193; 365/194
[58] Field of Search ............................. 365/189.05, 193, 365/194

[56] References Cited

U.S. PATENT DOCUMENTS

| | | | |
|---|---|---|---|
| 4,602,353 | 7/1986 | Wawersig et al. | 365/193 X |
| 5,014,245 | 5/1991 | Muroka et al | 365/194 |
| 5,365,482 | 11/1994 | Nakayama | 365/194 X |

FOREIGN PATENT DOCUMENTS 0182595  9/1985  Japan ...................... 365/194

*Primary Examiner*—David C. Nelms
*Assistant Examiner*—Son Dinh
*Attorney, Agent, or Firm*—Armstrong, Westerman, Hattori, McLeland & Naughton

[57] ABSTRACT

A semiconductor memory device is disclosed, having a plurality of memory cells, from which cell data is read out, based on at least one control signal provided to the memory device. The memory device includes a transfer gate which receives read data from one of the memory cells, a latch circuit which latches the read data sent from the transfer gate, and an output buffer which outputs data produced in accordance with the latched read data. The memory device further includes a transfer gate controller, which produces a latch control signal based on the control signal and supplies the latch control signal to the transfer gate to control an ON/OFF action of the transfer gate. A delay circuit, incorporated in the gate controller, controls level-switching timing for the latch control signal such that after switching the level of the control signal, the transfer gate is turned off with a predetermined delay.

8 Claims, 5 Drawing Sheets

Fig. 3A /RAS PRIOR ART
Fig. 3B /CAS PRIOR ART
Fig. 3C CB,/CB PRIOR ART
Fig. 3D LA1 PRIOR ART
Fig. 3E Dout PRIOR ART

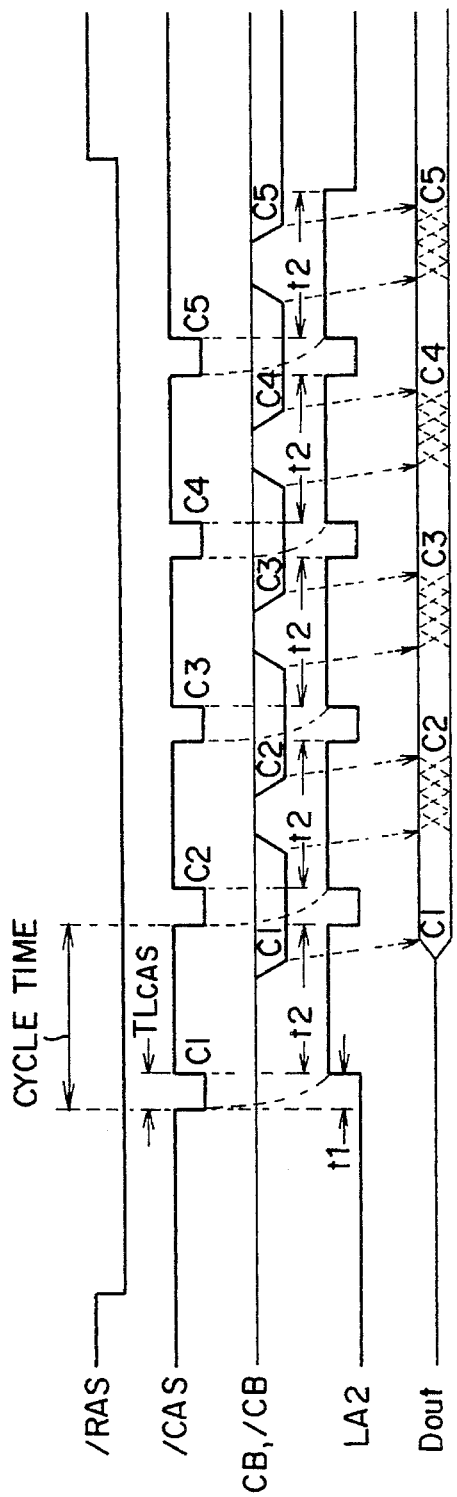

SEMICONDUCTOR MEMORY DEVICE

BACKGROUND OF THE INVENTION

1. Field of the Invention

The present invention relates to a semiconductor memory device having an EDO (Extended Data Out) function.

2. Description of the Related Art

In order to take advantage of the increasingly faster processing speeds of today's central processing units (CPUs), it is important to provide semiconductor memory devices which are designed to have faster operational speeds. The importance of matching increasingly fast CPUs with increasingly fast memory devices can be seen by the expanding demand for faster and more powerful microprocessor systems. These semiconductor memory devices frequently come equipped with an Extended Data Output function (EDO), effectively extending the time available for the device to perform data output reading operations. This ensures enhanced reading reliability despite the memory device's increased operational speed. Consequently, a demand currently exits to increase the data reading speed of EDO type semiconductor memory devices.

FIG. 1 shows the general constitution of a DRAM having an EDO function. Control signals /RAS (Row Address Strobe) and /CAS (Column Address Strobe), externally input to control the operation of the DRAM, are supplied to an address buffer 1. The control signal /RAS is input to the address buffer 1 as a signal to latch the row address, while the control signal /CAS is input to the address buffer 1 as a signal to latch the column address. The control signal /RAS is also input as an enable signal to an input/output (I/O) buffer circuit 2 and to a write clock generator 3. The control signal /CAS is likewise input to the I/O buffer circuit 2 as an I/O control signal, and to the write clock generator 3 as a signal to latch a write enable signal /WE that is also provided as input to the generator 3.

Based on the control signals /RAS and /CAS, address signals A0 to A9 input to the address buffer are latched in the address buffer 1 and output therefrom to a row decoder 4 and a column decoder 5. Based on the address signals A0–A9, the row decoder 4 and column decoder 5 select specific memory cells from among a plurality of memory cells in a memory cell array 6. In cell-data read mode, cell data read from the selected memory cells is output as output data Dout via a sense amplifier, an I/O gate 7 and the I/O buffer circuit 2. In cell-data write mode, write data Din input to the I/O buffer circuit 2 is written in the selected memory cells in the memory cell array 6 via the sense amplifier and I/O gate 7. The I/O buffer circuit 2 is controlled based on the write control signal /WE, input via the write clock generator 3 to the I/O buffer circuit 2, and on the aforementioned control signals /RAS and /CAS.

The output buffer section in the I/O buffer circuit 2 will be described below with reference to FIG. 2. In cell-data read mode, read data CB and /CB, read onto common buses from the sense amplifier and I/O gate 7, are input to transfer gates Tr1 and Tr2 each formed from a single N channel MOS transistor. The read data CB is input via the transfer gate Tr1 to a latch circuit 8a, and the read data /CB is input via the transfer gate Tr2 to a latch circuit 8b. A latch control signal LA1, output from a transfer gate controller 9, is input to the gates of the transfer gates Tr1 and Tr2. The transfer gate controller 9 functions based on the control signals /RAS and /CAS. This transfer gate controller 9 is formed from a single NOR gate 14. The NOR gate 14 outputs a high level latch control signal LA1 when the control signals /RAS and CAS both go low, and a low level latch control signal LA1 when at least one of the control signals /RAS and /CAS goes high.

The output signal of the latch circuit 8a is input to the gate of an N channel MOS transistor Tr3. The output signal of the latch circuit 8b is input to the gate of an N channel MOS transistor Tr4. The transistor Tr3 has its drain connected to a high-potential power supply Vcc and its source connected to both an output terminal $T_o$ and the drain of the transistor Tr4. The transistor Tr4 has its source connected to a low-potential power supply Vss. The transistors Tr3 and Tr4 constitute an output buffer 10. In the output buffer 10, either one of the transistors Tr3 and Tr4 is turned on, based on complementary signals sent from the latch circuits 8a and 8b. In accordance with the switching action of the transistor Tr3 or Tr4, the output data Dout is output from the output terminal $T_o$.

Referring to FIG. 3, a description will now be given of the operation of the DRAM in page mode where data is continuously read out by sequentially changing the column address at a time that the row address remains fixed. When the level of the control signal /CAS falls low following a drop in the control signal /RAS, cell data is output as the read data CB and /CB on the common buses at a predetermined time lag, in accordance with the selected column address. Following a slight lag time t3 after the falling of the control signal /CAS, the latch control signal LA1 goes high.

The timing at which the read data CB and /CB are read onto the common buses partially overlaps the timing at which the latch control signal LA1 maintains its H level. If the transfer gates Tr1 and Tr2 are turned on when control signal LA1 is high, the read data CB and /CB will be output as output data Dout from the output terminal $T_o$ via the latch circuits 8a and 8b as well as from the output buffer 10. This output occurs approximately in synchronism with the reading of read data CB and /CB onto the common buses.

Subsequently, when the control signal /CAS changes to a high level from a low level, the latch control signal LA1 goes low with a slight delay of time t3. As a result, the transfer gates Tr1 and Tr2 are turned off, and the read data CB and /CB are latched in the latch circuits 8a and 8b. Based on the latched data, the output data Dout remains being output. Should the column address signal be altered while the latched data is output, the control signal /CAS returns to a low level again. Then, new cell data is output as the read data CB and /CB on the common buses, based on a newly selected column address. The read data CB and /CB are then latched by the latch circuits 8a and 8b and are output as output data Dout in the above-described manner. Every time the level of the control signal /CAS falls low from a high level, therefore, cell data read from the selected memory cell is output as output data Dout with a predetermined time lag from the falling of the control signal /CAS.

According to the conventional DRAM, after the control signal /CAS changes from a low to a high level, the latch control signal LA1 falls low. In response to the falling of the control signal LA1, the read data CB and /CB read onto the common buses are latched in the latch circuits 8a and 8b. It is thus necessary to keep the control signal /CAS at a L level until the cell data read from the selected memory cell is output on the common buses as the read data CB and /CB.

One way to shorten the data reading cycle in conventional DRAMs, would be to shorten the operation time t4, shown in FIG. 3, from the point when the control signal /CAS falls low to the point when the read data CB and /CB are read out on their common buses. To accomplish this, significant improvements must be made to the structure of the memory cells, the cell layout or on the load driving performance of the sense amplifier. Such improvements, however, are not easily accomplished.

An alternative method to shorten the operation time t4 would be to alter the column address signal using faster timing in response to a falling control signal /CAS. Changing the column address signal this way, however, entails longer periods of time for setting up the column address signal. This presents a conflict between the specifications of the DRAM and the DRAM's control device.

SUMMARY OF THE INVENTION

Accordingly, it is a primary object of the present invention to provide a semiconductor memory device having a shortened reading cycle to improve the speed of reading data from the memory device, without changing the operational conditions of a DRAM or changing the basic performance of a memory cell array.

To achieve the foregoing and other objects and in accordance with the purpose of the present invention, an improved semiconductor memory device is provided.

A semiconductor memory device according to the present invention includes a plurality of memory cells, from which cell data is read out as read data, based on at least one control signal provided to the memory device. The memory device comprises a transfer gate, a transfer gate controller, a latch circuit and an output buffer. The transfer gate receives read data from one of the memory cells and outputs it to the latch circuit. The transfer gate controller produces a latch control signal based on the control signal provided to the memory device, and supplies the latch control signal to the transfer gate to control the ON/OFF switching of the transfer gate. The latch circuit latches the read data sent from the transfer gate. The output buffer produces data in accordance with the read data latched by the latch circuit, and operates to output data in cooperation with the latch circuit even when the transfer gate is turned off. A delay circuit is incorporated in the transfer gate controller. The delay circuit controls the level-switching timing for the latch control signal such that the transfer gate is turned off with a predetermined delay time after switching the level of the control signal provided to the memory device.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings in which:

FIG. 5 is a timing waveform chart illustrating the operation of the circuit shown in FIG. 4.

DETAILED DESCRIPTION OF THE PREFERRED EMBODIMENT

Figure 1:
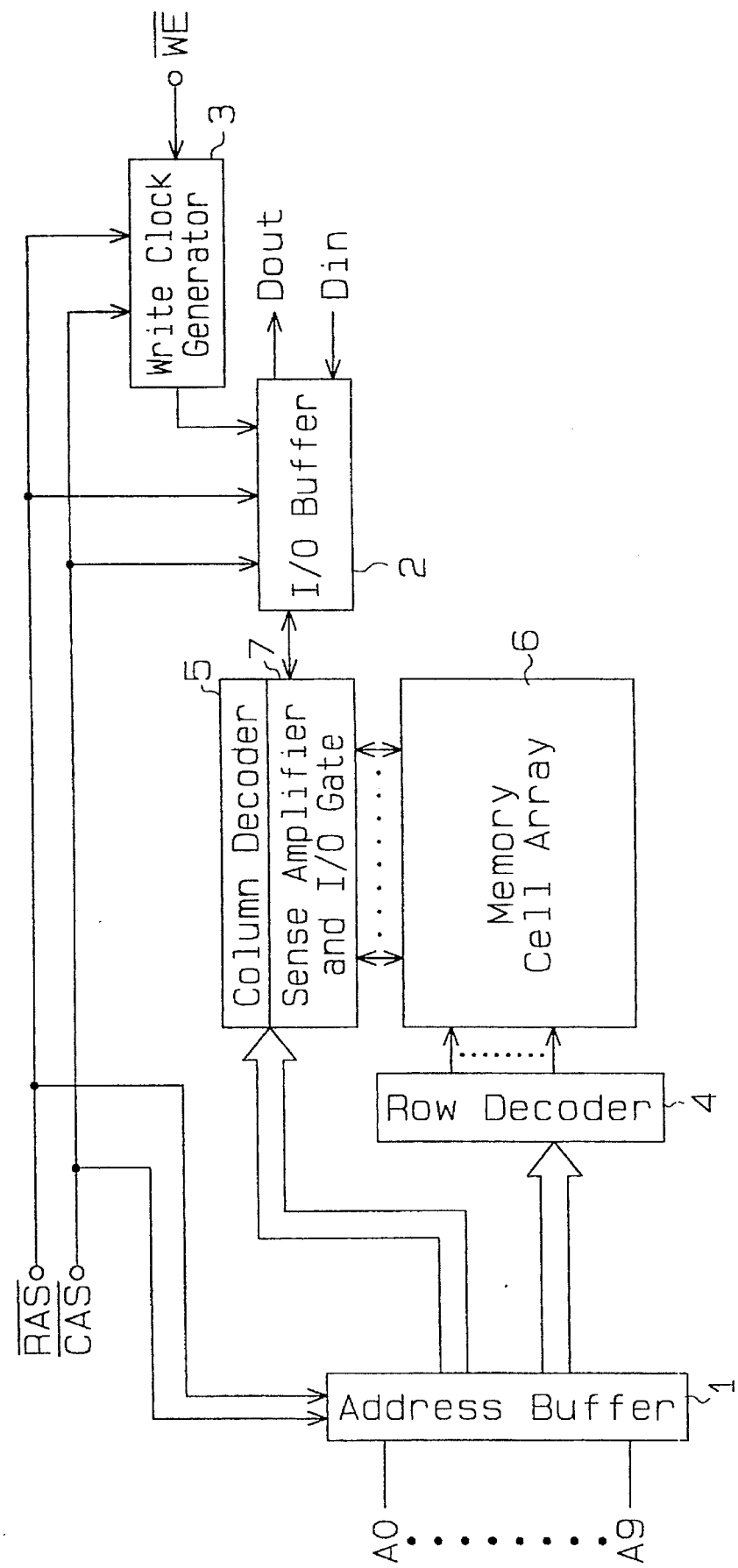
FIG. 1 is a block diagram illustrating the general constitution of a DRAM.
Figure 2:
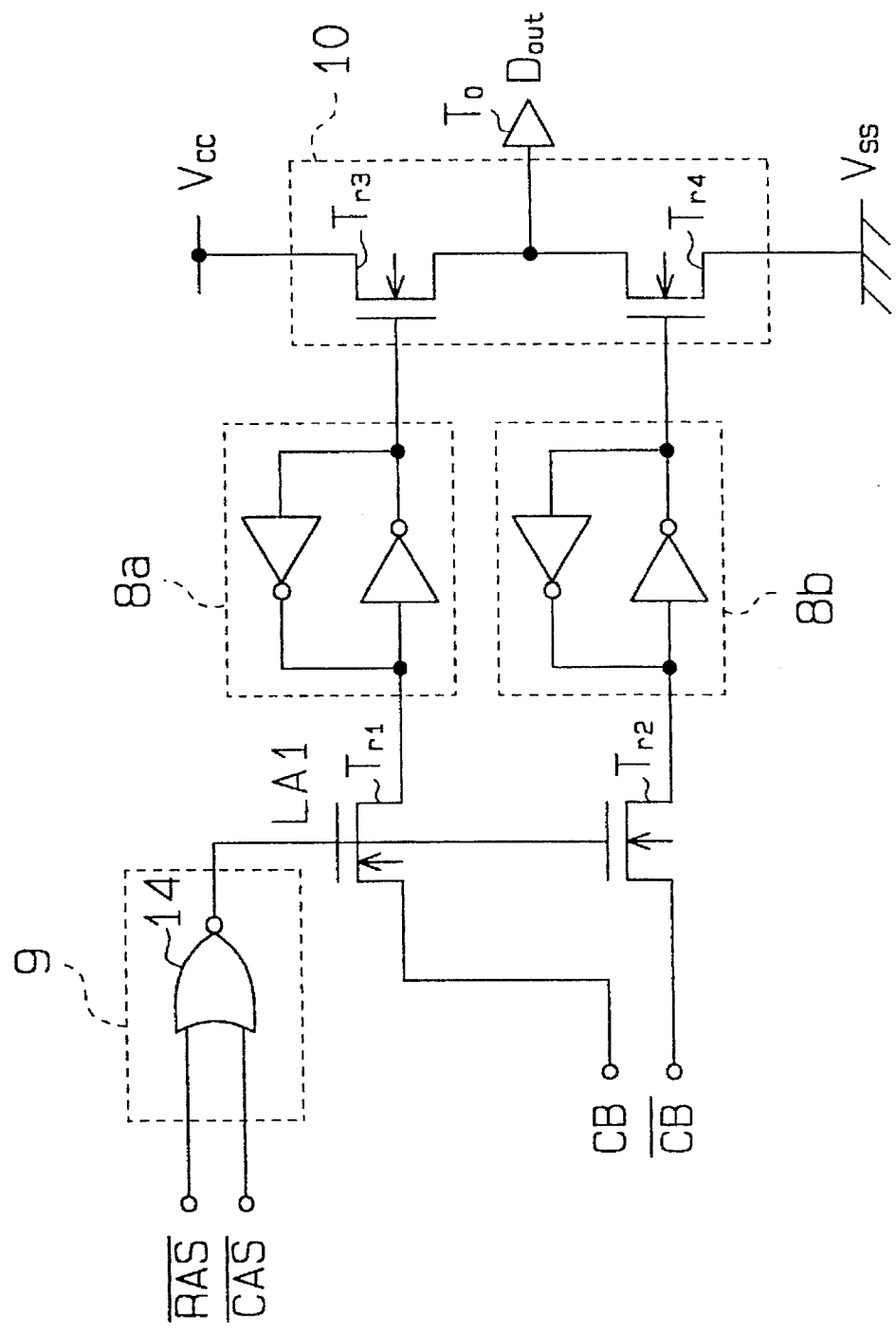
FIG. 2 is a circuit diagram showing a conventional art.
Figure 3:
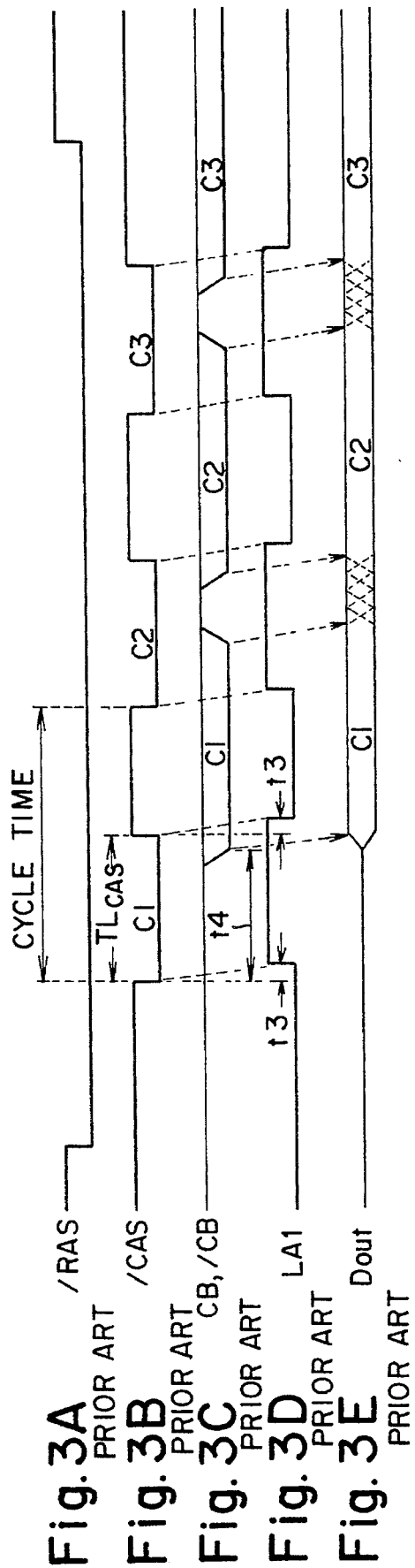
FIG. 3 is a timing waveform chart illustrating the operation of the conventional art.
Figure 4:
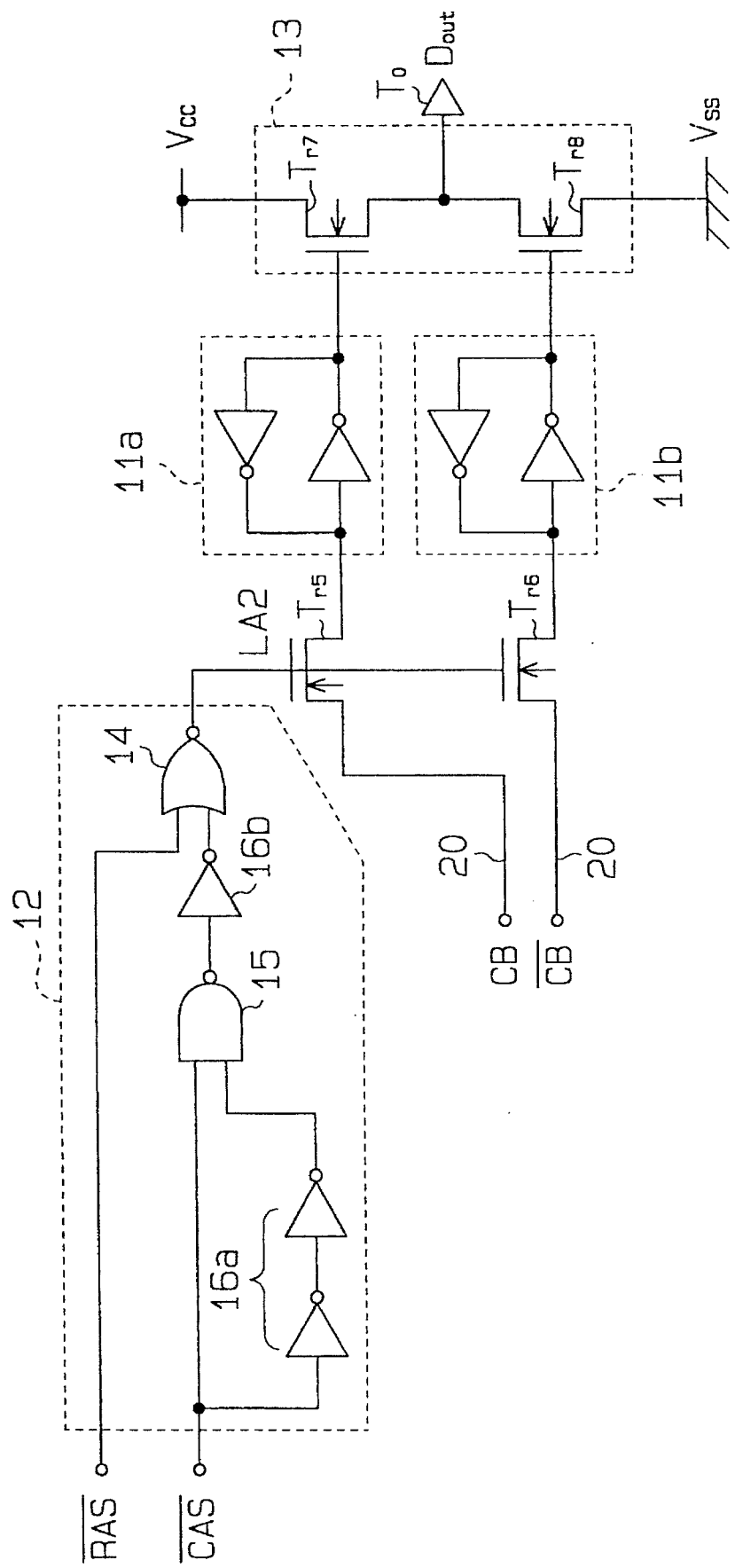
FIG. 4 is a circuit diagram illustrating an embodiment according to the present invention.

FIG. 4 shows the output buffer section in an I/O buffer circuit 2 of a DRAM embodying the present invention. In cell-data read mode, read data CB and /CB, read onto common buses 20, are input to transfer gates Tr5 and Tr6 each formed from individual N channel MOS transistors. The read data CB is input via the transfer gate Tr5 to a latch circuit 11a, while the read data /CB is input via the transfer gate Tr6 to a latch circuit 11b. A latch control signal LA2, output from a transfer gate controller 12, is input to the gates of the transfer gates Tr5 and Tr6. The transfer gate controller 12 functions based on the control signals /RAS and /CAS.

The output signal of the latch circuit 11a is input to the gate of an N channel MOS transistor Tr7, while the output signal of the latch circuit 11b is input to the gate of an N channel MOS transistor Tr8. The transistor Tr7 has its drain connected to a high-potential power supply Vcc and its source connected both to an output terminal $T_o$ and to the drain of the transistor Tr8. The transistor Tr8 has its source connected to a low-potential power supply Vss. The transistors Tr7 and Tr8 constitute an output buffer 13. In the output buffer 13, either one of the transistors Tr7 and Tr8 is turned on, based on complementary signals sent from the latch circuits 11a and 11b. In accordance with the switching action of the transistor Tr7 or Tr8, output data Dout is output from the output terminal $T_o$.

The transfer gate controller 12 includes a NOR gate 14, a NAND gate 15 and inverters 16a and 16b, and produces the latch control signal LA2 based on the control signals /RAS and /CAS.

The control signal /RAS is input to a first input terminal of the NOR gate 14. The control signal /CAS is input directly to a first input terminal of the NAND gate 15, and to a second input terminal of the NAND gate 15 via an even number of inverters 16a constituting a delay circuit. The output signal of the NAND gate 15 is input to a second input terminal of the NOR gate 14 via the single inverter 16b.

The transfer gate controller 12 outputs a high level latch control signal LA2 following a first delay time t1 from when the control signals /RAS and /CAS both go low, as shown in FIG. 5. The latch control signal LA2 next goes low following a second delay time t2 from when at least one of the control signals /RAS and /CAS goes high. The delay time t1 is determined by the sum of the operation times of the NAND gate 15, the inverter 16b and the NOR gate 14, and represents the time over the period during which the control signal /RAS remains low, from when the control signal /CAS falls low to when the latch control signal LA2 goes high, with the control signal /RAS kept at the L level. The delay time t2 is determined by the sum of the operation times of the inventer pair 16a, the NAND gate 15, the single inventer 16b and the NOR gate 14. Time t2 represents the time over the period the latch control signal LA2 is low from when the control signal /CAS goes high to when the latch control signal LA2 goes low. Consequently, the delay time t2 is longer than the delay time t1 by the operational time lag of the inverters 16a.

The operation of the output buffer section in the I/O buffer circuit 2 in page mode will now be discussed with reference to FIG. 5. cell data reading operations from the memory cell start after the control signal /CAS falls low with a low control signal /RAS. Based on a column address signal, read data CB and /CB are read on the common buses 20 with a predetermined time lag. Before the reading of the read data CB and /CB on the common buses 20 is completed, the latch control signal LA2 rises to a high level after the delay time t1 from the falling of the control signal /CAS. In synchronism with the rising of the latch control signal LA2, the transfer gates Tr5 and Tr6 open, allowing the read data CB and /CB to be supplied to the latch circuits 11a and 11b from the common buses 20. Following a rise in the control signal /CAS after the time period $TL_{CAS}$, and following delay time t2, the latch control signal LA2 falls to a low level. At the same time that signal LA2 falls, the transfer gates Tr5 and Tr6 close. The latch circuits 11a and 11b nonetheless latch the read data CB and /CB and continue to supply the read data to the output buffer 13. Based on the latched read data CB and /CB, the output buffer 13 keeps outputting the output data Dout.

When the control signal /CAS rises to a high level, the column address signal changes. When the control signal /CAS falls to the L level thereafter, read data CB and /CB from newly selected memory cell are output on the common buses 20.

Following this, the output buffer 13 outputs the output data Dout, based on the read data CB and /CB in the same manner as described above.

Thus, in the data outputting device according to this embodiment, when the predetermined delay time t2 elapses following the rising of the control signal /CAS, the latch control signal LA2 falls to a low level, causing the read data CB and /CB to be latched in the latch circuits 11a and 11b. It is therefore unnecessary to keep the control signal /CAS at a low level before the reading of the read data CB and /CB on the common buses 20 is completed. In other words, the control signal /CAS can be set high, before the reading of the data CB and /CB on the common buses 20 has been completed. This allows for a shorter time $TL_{CAS}$, during which the control signal /CAS is kept low. It is therefore possible to shorten the reading cycle to improve the reading speed, without changing the operational conditions of the DRAM or changing the basic performance of the memory cell array.

Although only one embodiment of the present invention has been described herein, it should be apparent to those skilled in the art that the present invention may be embodied in many other specific forms without departing from the spirit or scope of the invention.

This embodiment is to be considered as illustrative and not restrictive and the invention is not to be limited to the details given herein, but may be modified within the scope of the appended claims.

What is claimed is:

1. A semiconductor memory device including a plurality of memory cells from which cell data is read out as read data based on at least one control signal provided to the memory device, the semiconductor memory device comprising:

a transfer gate for receiving read data from one of said memory cells and for outputting said read data;

a transfer gate controller for producing a latch control signal based on first and second control signals provided to the memory device, and for supplying said latch control signal to said transfer gate to control the switching of said transfer gate;

a latch circuit for latching said read data sent from said transfer gate; and an output buffer for producing data in accordance with said read data latched by said latch circuit, said output buffer operating to output the produced data in cooperation with said latch circuit even when said transfer gate is turned off, wherein said transfer gate controller includes a delay circuit and a logic circuit, said logic circuit having an output terminal connecting to said transfer gate, a first input terminal receiving the first control signal and a second input terminal receiving the second control signal via said delay circuit, said delay circuit controlling the level-switching timing for said latch control signal in such a way as to turn on said transfer gate after a first delay time from a change in potential level of the second control signal and as to turn OFF said transfer gate after a second delay time from a subsequent change in potential level of the second control signal, and wherein said second delay time is longer than said first delay time.

2. The semiconductor memory device according to claim 1, wherein said delay circuit includes a product producing circuit having a first input terminal for directly receiving the control signal provided to the memory device and a second input terminal for receiving the control signal via a pair of inverters connected in series.

3. The semiconductor memory device according to claim 1, wherein said transfer gate includes a switching element that is turned on or off based on said latch control signal output from said transfer gate controller, and wherein said switching element when turned on outputs read data from one of said memory cells to said latch circuit, and when turned off inhibits read data from being output to said latch circuit.

4. The semiconductor memory device according to claim 1, wherein said transfer gate controller receives a row address strobe signal (/RAS) and a column address strobe signal (/CAS), and outputs a latch control signal to switches said transfer gate on when said strobe signals are both low, and that switches said transfer gate off when said row address strobe signal is low and said column address strobe signal is high; and wherein said delay circuit delays transition of said latch control signal from a high to a low level by said predetermined delay time (t2) after raising of said column address strobe signal to a H level.

5. A semiconductor memory device whose cell-data reading operation is performed based on a row address strobe signal, a column address strobe signal, a signal indicative of row address and a signal indicative of column address, comprising:

a memory cell array having a plurality of memory cells, wherein data contained in said memory cells is continuously read by said semiconductor memory device in page mode;

a switching element for receiving said cell data, read from one of said memory cells, as read data;

a gate controller for generating a latch control signal to activate or deactivate said switching element, based on said row address strobe signal and column address strobe signal provided thereto;

a latch circuit for latching said read data transferred from said switching element;

an output buffer for outputting data based on said read data latched by said latch circuit, wherein said output buffer continues the output of data based on said read data output from said latch circuit when said switching element is deactivated; and said gate controller outputting said latch control signal to activate said switching element when both the row address strobe signal and the column address strobe signal are low, and to deactivate said switching element after the elapse of a predetermined delay time (t2) when the row address strobe signal is low and when the column address strobe signal goes high.

6. The semiconductor memory device according to claim 5, wherein said gate controller includes a delay circuit comprising a NAND gate having a first input terminal for receiving said column address strobe signal and a second input terminal for receiving said column address strobe signal via an even number of inverter stages.

7. The semiconductor memory device according to claim 5, wherein said gate controller comprises:

a NOR gate having a first input terminal supplied with said row address strobe signal and a second input terminal; and a NAND gate having a first input terminal supplied with said column address strobe signal and a second input terminal for receiving said column address strobe signal via an even number of inverter stages, wherein the output signal of said NAND gate is input to said second input terminal of said NOR gate by an inverter.

8. The semiconductor memory device according to claim 1, wherein said first control signal is a row address strobe signal, and said second control signal is a column address strobe signal.

* * * * *